United States Patent [19]

Abe

[11] Patent Number: 4,730,115

[45] Date of Patent: Mar. 8, 1988

[54] TRANSFORMER SYSTEM AND DIRECT CURRENT POWER SUPPLY

[75] Inventor: Kozo Abe, Saitama, Japan

[73] Assignee: Logical Co., Ltd., Japan

[21] Appl. No.: 828,546

[22] Filed: Feb. 12, 1986

[30] Foreign Application Priority Data

Feb. 12, 1985 [JP] Japan .................................. 60-24635
Feb. 3, 1986 [JP] Japan .................................. 61-21644
Feb. 3, 1986 [JP] Japan .................................. 61-21645

[51] Int. Cl.$^4$ ............................................. H01L 31/16
[52] U.S. Cl. ...................................... 250/551; 307/311
[58] Field of Search ..................... 250/551; 307/311; 455/602, 606–608

[56] References Cited

U.S. PATENT DOCUMENTS 3,825,896 7/1974 Obenhaus ............................ 455/602
3,888,772 6/1975 Neuner ................................ 455/608
4,354,115 10/1982 Warabisako et al. ............... 250/551

Primary Examiner—Edward P. Westin
Attorney, Agent, or Firm—Franklin D. Wolffe; Morris Fidelman

[57] ABSTRACT

The present invention relates to a transformer system and a direct current power supply for obtaining a dc current including a luminous body disposed on the primary side for converting a electric power into a light and a solar cell unit disposed on the secondary side, opposing the luminous body, for receiving light emitted from the luminous body and for converting the light into electric power, thereby constituting a transformer which is further provided with an input control circuit and an output control circuit so as to configure a dc power supply. According to this apparatus, a stable dc current can be obtained without generating the magnetic field and noise problems of typical wound core transformers.

7 Claims, 12 Drawing Figures

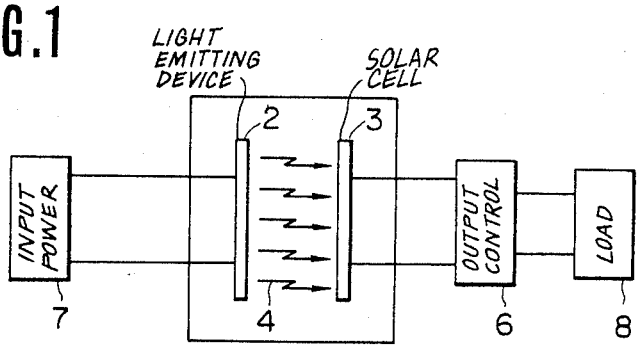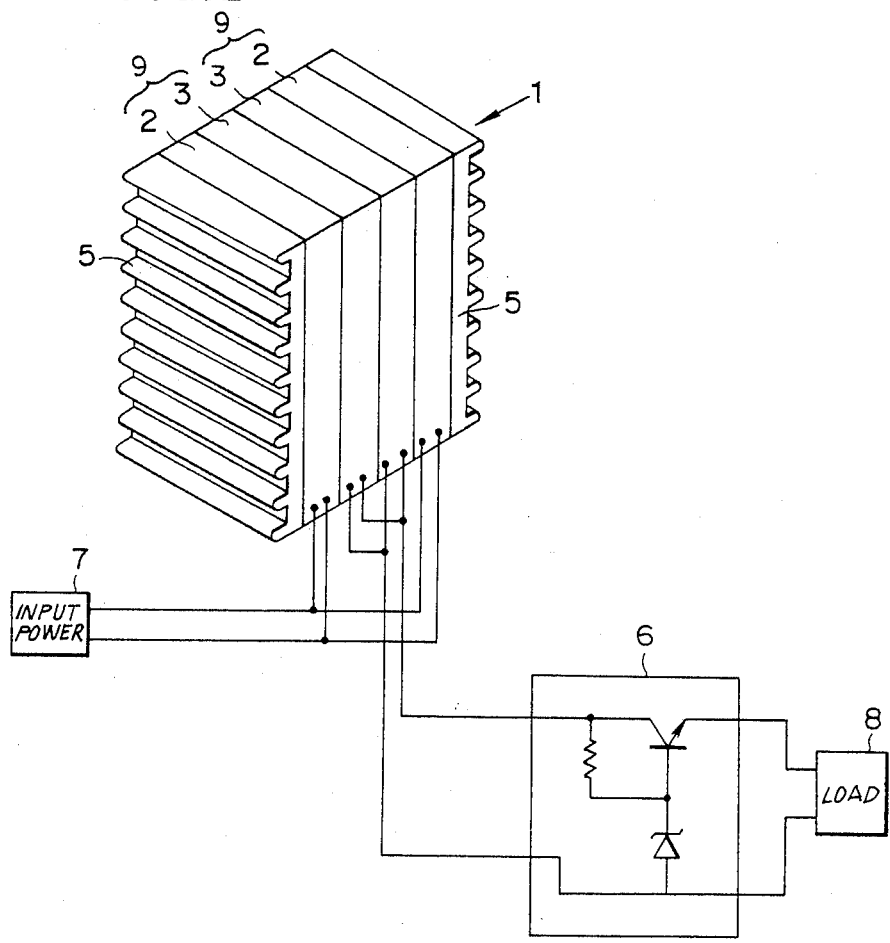

TRANSFORMER SYSTEM AND DIRECT CURRENT POWER SUPPLY

BACKGROUND OF THE INVENTION

The present invention relates to a transformer system and a direct current (dc) power supply constructed to obtain a direct current power, thereby supplying a stable dc power without noise irrespective of a kind of external power supply connected to the primary coil side thereof.

According to the transformation process in the conventional transformer system, when a voltage of an alternate current (ac) power, for example, a commercial power is transformed, a transformer configured with an iron core on which coils are wound is utilized. If a dc current is to be obtained by increasing or decreasing a voltage of a dc power supply, the dc power is first transformed into ac power by use of a switching operation, then the ac current is transformed by a transformer formed with an iron core on which coils are wound.

In the transform operation of this transformer, an ac power must be supplied to the primary coil thereof so that an ac power is induced on the side of a secondary coil according to a change in a magnetic flux generated by the ac current flowing through the primary coil.

In order to transform this ac power into dc power, the ac power must be subjected to a rectification.

However, when an alternating current is converted into a direct current, the resultant direct current is accompanied by an ac component which appears as a pulsating current in the direct current.

The pulsating current appearing in the direct current thus obtained by use of a transformer and a rectifier exists in any case, and it is impossible at present to completely remove the pulsating current.

A transformer system including such a transformer has such serious drawbacks that the direct current output from the secondary coil side contains the pulsating current and, since the primary coil is linked to the secondary coil by a magnetic flux in this transformer, noise on the primary coil side is transferred to the secondary coil side and appears in the power supplied from the secondary coil side.

According to the conventional complex method for eliminating the noise, a filter having a fixed bandpass is disposed to remove the noise, and thus primary power from which the noise has been removed is supplied to the transformer. However, due to the operational principle of the transformer, it is impossible to obtain from an ac power supply a dc current free from the pulsating current, switching noise, and the transferred noise by use of the transformer.

Moreover, the magnetic flux generated in a transformer has a great influence on the environments thereof, so as to cause serious trouble to electronic devices such as a computer which handles a magnetic recording medium.

To prevent such an influence, a complete magnetic isolation is necessary for the transformer. As a result, the structure of the system using this transformer becomes complicated, the shape thereof is restricted, and the installation place is limited.

The present invention relates to a transformer system and a dc power supply including the same in which the problems of the conventional apparatus are solved.

BRIEF DESCRIPTION OF THE DRAWINGS

The objects and features of the present invention will become more apparent from the consideration of the following detailed description taken in conjunction with the accompanying drawings in which:

FIG. 1 is a schematic diagram illustrating the basic configuration of a transformer system according to the present invention;

FIG. 2 is a diagram depicting the configuration of a transformer system including two sets of transformers.

DESCRIPTION OF THE PREFERRED EMBODIMENTS

Figure 3:
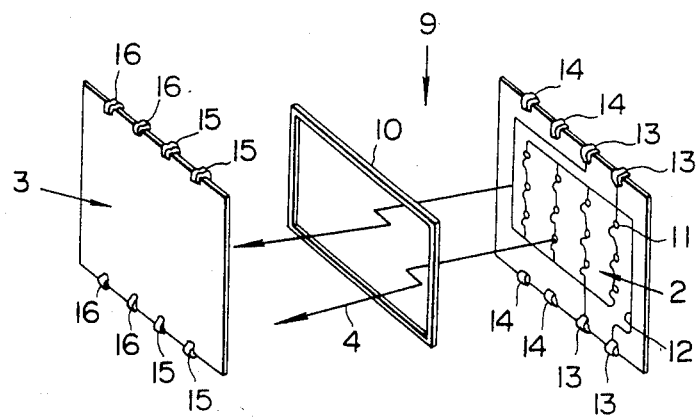
FIG. 3 is a disassembly diagram illustrating components of the transformer.

The present invention will be described by referring to the accompanying drawings.

FIG. 1 is a diagram showing the basic configuration of the present invention. This configuration includes a luminous body 2 such as a light emitting diode (LED) constituting a primary side and connected to an external power supply 7 and a solar cell unit 3 constituting a secondary side and spaced opposite of the luminous body 2 so as to be connected to the luminous body 2 by light 4. The luminous body 2 is so selected as to irradiate a quantity of light at least equal to a fixed quantity of light determined according to the rating of the solar cell unit 3; furthermore, the luminous body 2 is located relative to the solar cell unit so as to irradiate the solar cell unit 3 with a quantity of light at least equal to a fixed quantity of light determined according to the rating of the solar cell unit 3.

In addition, an output control section 6 is disposed on a side of a load 8. The output control section 6, for example, functions to adjust a voltage, to control a current, or a function to disconnect the circuit when the value of an output voltage from transformer system 1 exceeds a preset voltatge. Consequently, a combination of the transformer system 1 according to the present invention and the control section 6 can be utilized as a dc power supply 21 generating a dc power having a satisfactory quality.

Although FIG. 2 is a simple and concrete example of a control section is considered a configuration of FIG. 2 in which a combination of a transistor and a zener is included, it is advisable to use such a control section generally known as a power control integrated circuit (IC) in practical use.

In FIG. 2, the luminous body 2 and the solar cell unit 3, each having a planar shape, are fixed to, each other with a luminating surface of the luminous body 2 opposing a light receiving surface of the solar cell unit 3, and a heat radiating plate 5 is integratedly fixed to the luminous body 2, thereby forming a transformer 9. Moreover, two transformers 9 are mounted with the rear surfaces of each solar cell unit 3 being fixed to each other and are electrically connected in parallel to each other, thereby configuring a transformer system 1.

FIG. 3 is a disassembly diagram showing components of the transformer 9 constituting the transformer system 1. A printed circuit 12 of the luminous body 2 has at ends thereof electrodes to be connected to the external power supply 7. Between the luminous body 2 and the solar cell unit 3, there is disposed a frame body 10 having a shape enclosing the illuminating surface of the luminous body 2 and the light receiving surface of the solar cell unit 3, the frame body 10 having a fixed thickness and not allowing the light 4 to pass therethrough.

The frame body 10 prevents the light 4 irradiated from the luminous body 2 from leaking out therefrom. As a result, the photoelectric conversion is achieved with a satisfactory stability.

Moreover, the frame body 10 provides a space between the luminous body 2 and the solar cell unit 3, and the space enables the light 4 emitted from a luminous element 11 to diffuse and uniformly illuminate the overall solar cell unit 3, which also enhances the stable photoelectric conversion.

In addition to a luminous body electrode 13 to be connected to the external power supply 7, the luminous body 2 is provided with a solar cell body connecting electrode 14, whereas in addition to a solar cell unit electrode 16 to be connected to the load 8, the solar cell unit 3 is provided with a luminous body connecting electrode 15. With these provisions, a plurality of transformers 9 can be used in a parallel arrangement.

The inner surfaces of the luminous body 2 and the frame body 10 are coated with a reflective film 17 to prevent the light 4 irradiated from the luminous body 2 from being absorbed by the luminous body 2 and the frame body 10 because the light 4 is illuminated thereto due to reflection. On the contrary, the inner surfaces of the solar cell unit 3 are coated with a nonreflective film 18 so as to effectively absorb the light 4 irradiated from the luminous body 2.

Moreover, a radiating plate 5 is disposed on an outer surface of the luminous body 2 for radiating heat generated in the luminous body 2.

Figure 4:
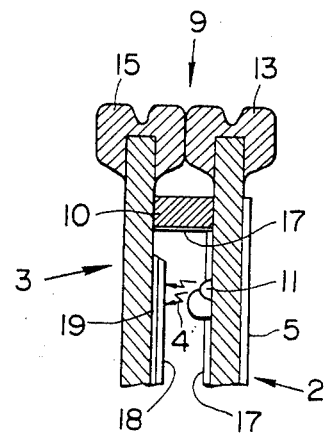
FIG. 4 is a diagram depicting a cross section of a portion of the transformer.

FIG. 4 is a schematic diagram illustrating a cross section of a magnified portion of the transformer 9.

Incidentally, in a transformer system 1 in which transformers comprising 16 luminous elements each including a known light emitting diode are configured in a form of 3-parallel, 12-serial connections, an output of 6 V, 900 mA is obtained for an input of 12 V, 22 A (approx.); when the transformers 9 are configured in a 1-parallel, 48-serial connections, an output of 24 V, 300 mA is obtained for an input of 12 V, 30 A.

Figure 5:
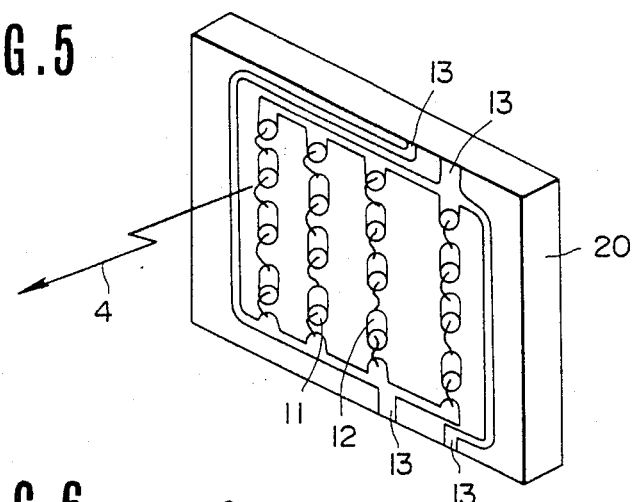
FIGS. 5, 6 and 7 are diagrams illustrating luminous bodies.
Figure 6:
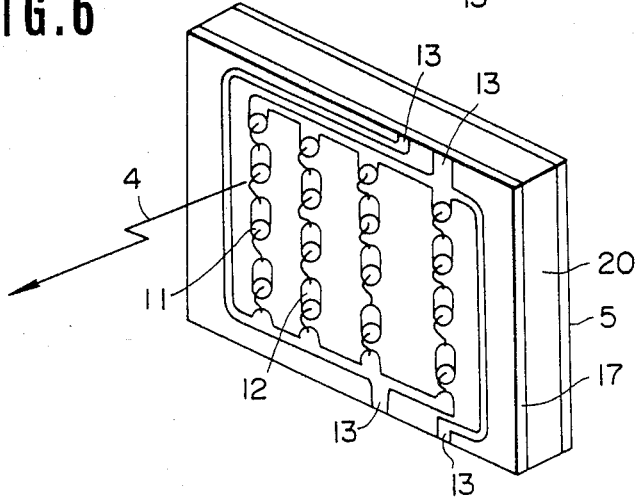
Figure 7:
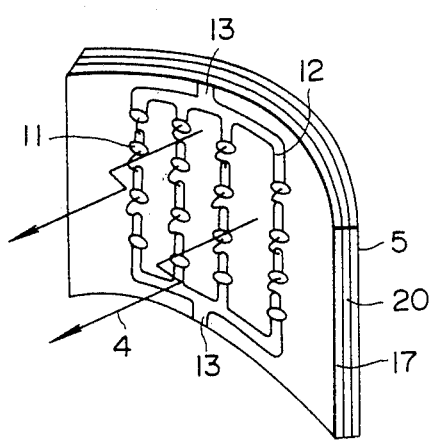

FIGS. 5-7 are diagrams illustrating luminous bodies 2. Components of the luminous element 11 of the luminous body 2 are not limited. That is, any components that effect an illumination, for example, elements using electroluminescence, a laser, a halogen lamp, light emitting diode or the like can be used.

FIG. 5 is a diagram showing the luminance body 2 comprising a printed circuit plate 20 formed with a ceramic material. The illuminating surface of the luminance body 2 is required to effectively reflect the light 4 so that the light receiving surface of solar cell 3 will efficiently absorb the light 4. In this regard, a ceramic material, particularly a white ceramic material is suitable for the substance of the printed circuit plate 20 because it effectively reflects the light 4.

Moreover, the ceramic material has a high heat conductivity and hence develops an excellent radiating effect. Consequently, the luminous body 2 need not especially be provided with a component such as the heat radiating plate 5.

FIG. 6 is a diagram illustrating a luminance body 2 comprising a printed circuit plate 20 formed with a bakelite material. Since the bakelite material is not particulalry satisfactory in the reflection of the light 4 and the heat dissipation effect, the illuminating surface is coated with the reflective plate 17 and the rear surface is coated with a radiating material having a high heat radiating effect.

FIG. 7 is a diagram illustrating a luminance body 2 comprising a printed circuit plate 20 formed with a flexible material.

Consequently, the light emitting device 2 can be used in a state in which the light emitting device 2 is kept deformed elastically, and thus the luminous body 2 can be operated in a narrow space or in a space of which the shape is limited.

Figure 8:
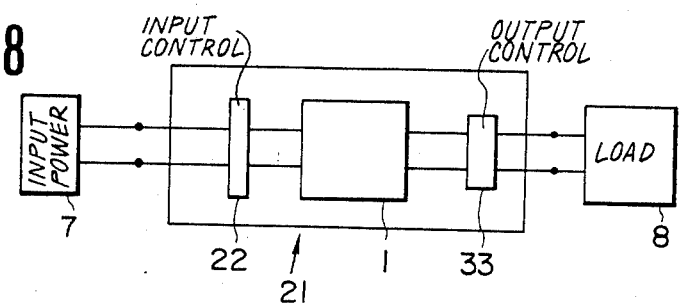
FIG. 8 is a diagram showing the configuration of a dc power supply.

FIG. 8 is a schematic diagram illustrating a dc power supply 21 using the transformer system 1 according to the present invention.

This configuration basically includes an input control circuit 22 disposed on the input side of the transformer system 1 for protecting the transformer system 1 against an abnormality of an input power supplied from the external power supply 7 and an output control circuit 33 for supplying the output side of the transformer system 1 with a fixed power required for the load 8 and for maintaining an output of a preset, fixed power without being influenced by a change in the load 8.

Examples of input control circuit 22 are a safety circuit using an ordinary fuse and a surge absorber using a varister or the like.

As the output control circuit 33, a well-known constant-voltage or constant-current circuit may be used without any modification.

Figure 9:
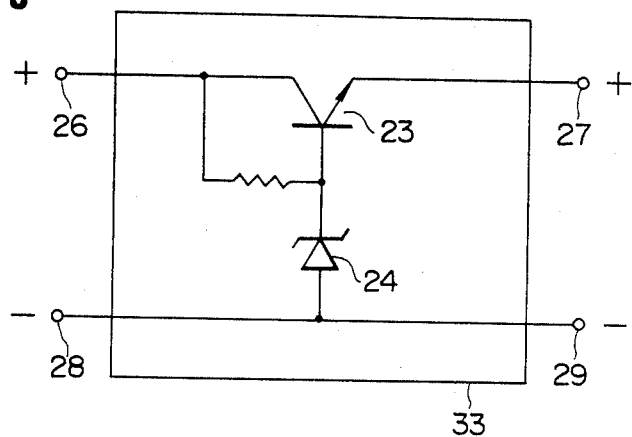
FIGS. 9, 10 and 11 are schematic circuit diagrams illustrating output control circuits.
Figure 10:
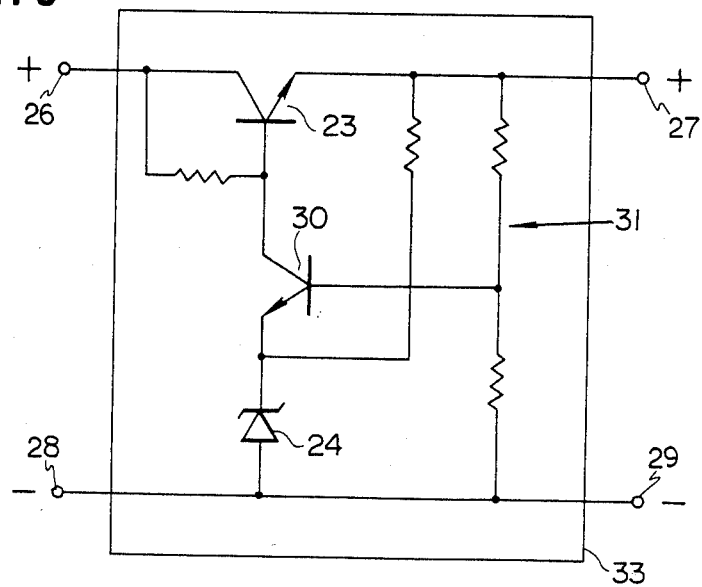

FIGS. 9–10 are diagrams illustrating circuit examples which are considered to be most fundamental when a constant-volume circuit is used as the output control circuit 33.

In FIG. 9, there is connected between an input terminal of positive polarity 26 and an output terminal of positive polarity 27 a control transistor 23 as a control element by use of a collector and an emitter thereof, and between an input terminal of the negative polarity 28 and an output terminal of the negative polarity 29 a base of the transistor 23 via a zener diode 24; furthermore, a resistor is connected between the collector and the base of the transistor 23.

A reference voltage of the output control circuit 33 of FIG. 9 is established by the zener diode 24. The potential difference between the input voltage and the output voltage is related to the collector and the emitter of the transistor 23 and increases or decreases depending on a change in the input voltage and the load 8 to maintain the output voltage to be constant.

In the output control circuit 33 of FIG. 10, a control transistor 23 with a resistor connected between the collector and the base thereof is inserted between the input terminal 26 and the output terminal 27 by use of the collector and the emitter thereof, which is connected at an intermediate point between the input terminal 28 and the output terminal 29 via a serial connection of an amplifying transistor 30 and a zener diode 24. A cathode of the zener diode 24 is further connected through a resistor to the emitter of the control transistor 23, and a base of the amplifying transistor 30 is connected to a voltage dividing point between the output terminals 27-29 constituting a voltage dividing circuit 31.

As in the circuit of FIG. 9, the zener diode 24 sets the reference voltage and the transistors 30 and 23 function as control elements in the output control circuit 33 of FIG. 10.

In the case of FIG. 10, however, there is provided the amplifying transistor 30 not found in FIG. 9, and this transistor 30 serves as an error signal amplifier, which enhances the efficiency of the circuit when compared with that of FIG. 9.

Figure 11:
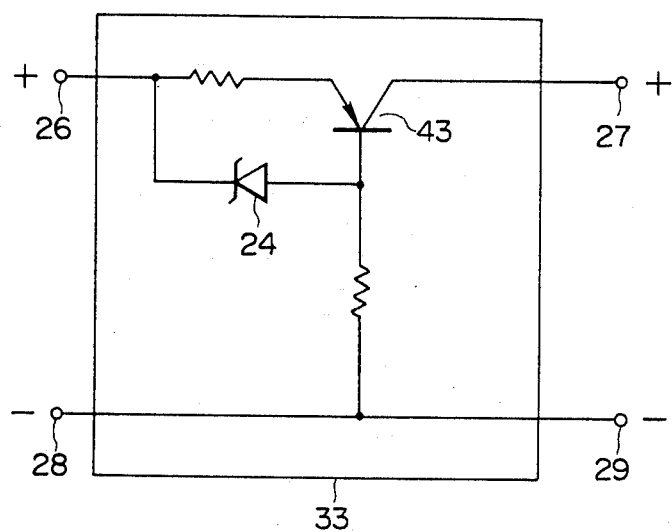

In the circuit of FIG. 11, a constant-current circuit is adopted as the output control circuit 33. The transistor 43 as a control element is serially connected to a resistor and this serial combination is inserted between the input terminal 26 and the output terminal 27. The base of the transistor 43 is connected via another resistor to the input terminal 28 and the output terminal 29, and the zener diode 24 is inserted between the input terminal 26 and the base of the transistor 43.

In the circuit of FIG. 11, the output current is kept constant irrespective of a change in the input voltage and the load 8.

Circuits of various configurations can be used as the output control circuit 33 as described above. However, since a variety of IC devices including constant-voltage and constant-current IC devices are commercially available at present, it is advantageous to select such appropriate IC devices for practical use.

Figure 12:
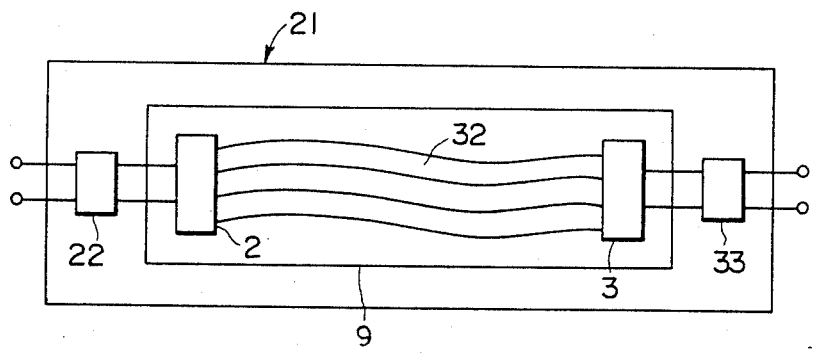
FIG. 12 is a diagram depicting the configuration of a dc power supply including a transformer system using an optical fiber.

FIG. 12 is a schematic circuit diagram of a dc power supply including a transformer system in which an optical fiber 32 is used to link the luminous body 2 and the solar cell unit by use of a light.

Power supplied from the external power supply 7 is converted into optical energy by the luminous body 2 and is transferred via the optical fiber 32 to the solar cell unit 3.

In accordance with the transfer system using the optical fiber, a magnetic field and an electromagnetic field are not generated in the environments surrounding the system; furthermore, the system is free from effect by an external electromagnetic field, and hence the light energy from the luminous body 2 can be directly transferred to the solar cell unit 3.

As a result, a power of a high quality can be passed from the primary side to the secondary side of the system and, electronic apparatus may be installed in the neighborhood of the optical fiber 32 without affecting transformation.

In addition, the electromagnetic induction noise can be completely eliminated from the transferred power, and therefore when the overall system of the secondary side including the load 8 is installed in an electromagnetic shielding cabinet, the electronic devices in the shielding cabinet can be operated in an environment free from external electric effect from such power transfer.

A halogen lamp generating a satisfactory quantity of light is advantageously used as the luminous body 2 in the transformer system 1 in which the optical fiber 32 is adopted to link the luminous body 2 and the solar cell unit 3.

In addition to providing a satisfacotry quantity of light, the halogen lamp has an advantage that wavelengths of the light irradiated therefrom match with the wavelengths for which the photoelectric conversion is most efficiently achieved, which allows the solar cell unit 3 to accomplish an effective photoelectric conversion.

In the configuration described above, in which the luminous body 2 converting the power from the external power supply 7 into the light 4 is disposed on the primary side and the solar cell unit 3 receiving the light 4 from the luminous body 2 and converting the light 4 into a dc power is provided on the secondary side, the magnetic or electric link between the primary and secondary sides in not established at all. Consequently, the noise on the primary side is not transferred to the secondary side, thereby implementing the transformer system 1 supplying a dc power with a higher quality.

Moreover, since the transformer system 1 using the luminous body 2 on the primary side can obtain a stable output dc power on the secondary side irrespective of the kind of input ppower on the primary side, components conventionally required to generate the output dc power such as a rectifier circuit and a smoothing circuit are not necessitated, which enables the system to be configured in a very simple structure.

In the transformer system 1, the luminous body 2 and the solar cell unit 3 are only linked by the light 4, and the shape of each component is not limited. Consequently, these components can be manufactured in arbitrary shapes suitable for the utilization purposes and conditions.

Furthermore, since the transformer system 1 does not generate a magnetic field and a noise in the environments thereof, the installation place is not limited, which allows the transformer device 1 to be operated with other electronic parts, for example, in a limited narrow space without causing any failures.

In addition, the printed circuit plate 20 of the luminous body 2 has a heat radiating function, which prevents troubles that may take plate if the luminous body 2 is heated up.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

I claim:

1. An electrical transformer system comprising:
   a plurality of transformers each comprising a primary and secondary and said transformers being connectable, selectively, in series, parallel, and series-parallel, with a primary of at least one of said transformers connectable to an input power supply and with a secondary of at least one of said transformers connectable to a load;
   each said secondary comprising a solar cell unit generative of a certain amount of electricity in response to a rated quantity of light received and according to a particular rating for said solar cell unit;
   each said primary comprising a light emitting device situated to provide at least said rated quantity of light to said solar cell unit upon energization by said input power supply; and
   said light emitting device comprising a heat radiating means for dissipating heat therefrom.

2. An electrical transformer system as in claim 1, and each said light emitting device further comprising:

plural luminous elements electrically interconnected in a printed circuit, with terminals of said circuit connectable to said input power supply selectively in series, parallel, and series-parallel arrangements.

3. An electrical transformer system as in claim 2, and said heat radiating means comprising:
a substrate for said printed circuit, said substrate consisting of a material sufficient to provide for said heat dissipating.

4. An electrical transformer system as in claim 3, and further comprising:
said substrate material being flexible.

5. A transformer system according to claim 2 wherein a light emitting surface of said printed circuit comprises a reflective film coating and a rear surface thereof comprises a heat radiating coating.

6. An electrical transformer system as in claim 1, and further comprising:
an optical fiber conducting light between said light emitting device and said solar cell unit; and
electromagnetic shielding of at least said secondary and load.

7. A transformer system according to claim 1, and further comprising:
an input control means disposed on an input side of the transformer system for protecting the light emitting device thereof; and
an output control means disposed on an output side of the transformer system for adjusting and outputting a desired constant power.

* * * * *